United States Patent
Shih et al.

(10) Patent No.: US 6,586,787 B1
(45) Date of Patent: Jul. 1, 2003

(54) SINGLE ELECTRON DEVICE

(75) Inventors: Sheng-Ming Shih, Taipei (TW); Wei-Fang Su, Taipei (TW); Yuh-Jiuan Lin, Taipei (TW); Cen-Shawn Wu, Tainan (TW); Chii-Dong Chen, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/230,103

(22) Filed: Aug. 29, 2002

(30) Foreign Application Priority Data

Feb. 27, 2002 (TW) ........................................ 91103632 A

(51) Int. Cl.[7] ............................................ H01L 31/112
(52) U.S. Cl. ............................. 257/288; 257/9; 257/14; 257/20; 257/23; 257/30; 365/149; 365/150; 365/161; 365/163; 365/186
(58) Field of Search ............................. 257/288, 9, 14, 257/20, 23, 30; 365/149, 150, 161, 163, 186

(56) References Cited

U.S. PATENT DOCUMENTS

| | | | | |
|---|---|---|---|---|
| 5,420,746 A | * | 5/1995 | Smith | 361/311 |
| 5,731,598 A | * | 3/1998 | Kado et al. | 257/30 |
| 6,159,620 A | * | 12/2000 | Heath et al. | 428/615 |
| 6,483,125 B1 | * | 11/2002 | Brousseau, III | 257/69 |
| 6,487,112 B1 | * | 11/2002 | Wasshuber | 365/163 |

FOREIGN PATENT DOCUMENTS

JP     11266007 A    *   9/1999

* cited by examiner

Primary Examiner—Nathan J. Flynn
Assistant Examiner—Remmon R. Fordé
(74) Attorney, Agent, or Firm—Sughrue Mion, PLLC

(57) ABSTRACT

A single electron device. Fabricated from nanoparticle derivatives, particularly from Au and fullerene nanoparticle derivatives, the device reduces thermal fluctuation in the nanoparticle array and has 15 nm of spacing between two electrodes.

21 Claims, 4 Drawing Sheets

SINGLE ELECTRON DEVICE

BACKGROUND OF THE INVENTION

1. Field of the Invention

The present invention relates to a single electron device fabricated from nanoparticle derivatives, and in particular to a single electron device fabricated from Au and fullerene nanoparticle derivatives.

2. Description of the Related Art

Single electron devices have the advantages of low power consumption and high packing density and thus have received much attention in various applications recently.

Referring to FIG. 1a, a schematic top view of the structure of a conventional single electron transistor is shown. In this FIG. 1a, ISO is an insulation structure; S and D are respectively a source electrode and a drain electrode, OX is a tunneling oxide layer; dot is a cluster of nanoparticles, which possesses a dot shape in three dimensional space and for which the lengths along the directions of x, y, and z axes in the coordinate system generally have to be less than 500 A (angstrom); and e⁻ represents a moving electron. FIG. b shows the movement of an electron in the single electron transistor shown in FIG. 1a, wherein G is a gate electrode (not shown in FIG. 1a).

In the structure of the conventional single electron transistor (SET) mentioned above, the source electrode S, the nanoparticles, and the drain electrode D are isolated by the extremely thin tunneling oxide layer OX. Under a specific source-drain electrode bias, the electron from the source electrode can arrive at the nanoparticles first by passing through the tunneling oxide layer, and then arrive at the drain electrode by passing through the tunneling oxide layer, to facilitate the conductivity of the single electron transistor.

The operating temperature of SET depends on the geometrical size of the nanoparticles, that is, the smaller, the better, thus presenting a challenge to modern semiconductor manufacturing technology. Conventionally, the processes to fabricate SET are mostly related to e-beam lithography, and for resolution of limitations in space, the structural sizes constructed by the technology of e-beam lithography are still more than 10 nanometers. The methods of using nano-structured materials having critical sizes less than nanometers are presented to overcome the technical limitation mentioned above, however, it is difficult in practical applications to allow the nano-structured materials to contact electrodes, although the nano-structured materials can be prepared by synthesis technology. Therefore, the utilization of self-assembly nanometer building-blocks to fabricate nanodevices has become the most frequently investigated method, due to high feasibility.

Up to now, there have been many reports regarding the assemblies of two-dimensional arrays of quantum dots by lithography and epitaxy depositions. Alternatively, by way of the solution chemical process, a bridge can be formed by organic molecules such as alkyldithiols, surfactants, organic polymers, conjugated DNAs, or biomimic conjugated systems molecules to assist the regular assembly of metals, insulators, and semiconductor nanoparticles. Two- or three-dimensional nanoparticle arrays can be constructed through the formation of covalent bonds, hydrogen bonds, or van der Waals forces by the methods mentioned above. Therefore, the self-assembly process provides a feasible way to fabricate nanodevices.

Accordingly, the invention discloses single electron devices that can reduce thermal fluctuation of nanoparticle arrays due to fullerene derivatives presenting rigid carbon balls with good thermal stability, and moreover, Au and fullerene nanoparticle derivatives that overcome the size limitation of the semiconductor manufacturing skill to fabricate single electron devices with 15 nm spacing between two electrodes.

SUMMARY OF THE INVENTION

Accordingly, an object of the invention is to provide a single electron device fabricated from nanoparticle derivatives.

Another object of the invention is to provide a single electron device fabricated from Au and fullerene nanoparticle derivatives.

Still another object of the invention is to provide a nanoparticle derivative for use as a bridge linking to two electrodes.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1b shows the movement of an electron in the single electron transistor shown in FIG. 1a;

DETAILED DESCRIPTION OF THE INVENTION

Figure 1A:
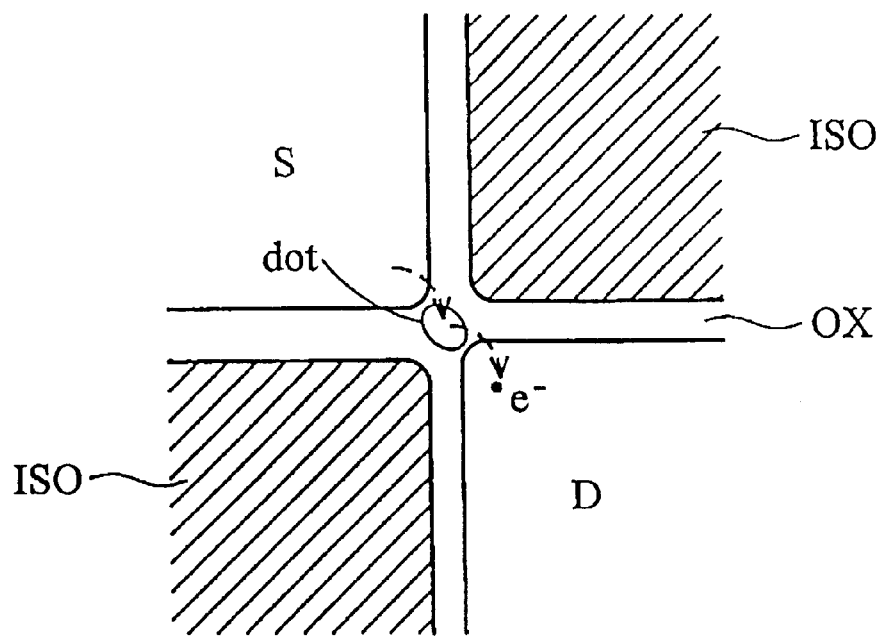
FIG. 1a is a schematic top view showing the structure of a conventional single electron transistor as referenced in the prior art.
Figure 1B:
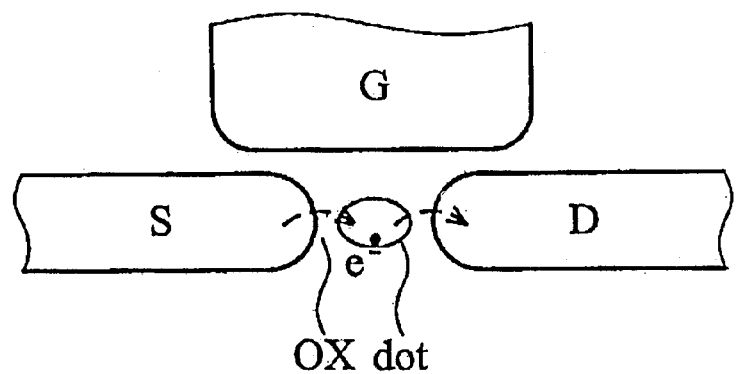

The first object of the present invention is to provide a single electron device, fabricated from nanoparticles and comprising a first electrode, a second electrode disposed to face the first electrode, and a nanoparticle derivative in a determined array, as a bridge linking to the first electrode and the second electrode, having formula (I):

(I)

wherein,

M represents nanoparticles of Au, Ag, Pd, or Pt; and A has formula (II):

(II)

wherein
X is N, S, or

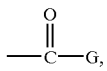

wherein G=OH or $NH_2$;

R is a $C_{1-12}$ alkyl group, a $C_{1-12}$ cycloalkyl group, or a substituted or unsubstituted aromatic group; and F is $C_{60}$, $C_{70}$, or a carbon nanotube.

In the single electron device fabricated from the nanoparticle derivatives according to the invention mentioned above, the operating temperature of the device can be efficiently elevated because the rigidness of the nanoparticle derivatives used can reduce the thermal fluctuation in the nanoparticle arrays. Furthermore, the utilization of the nanoparticle derivatives in the present invention can overcome the size limitations in the technology of semiconductor manufacturing process, and thus minute single electron devices with a spacing less than 15 nm between two electrodes mentioned above can be achieved.

Furthermore, in the single electron device of the first present invention, the first electrode is a source electrode and the second electrode is a drain electrode. The determined array can be one-, two-, or three-dimensional.

Additionally, the single electron device according to the first present invention may comprise a third electrode disposed to face the first electrode and the second electrode. Furthermore, the third electrode is a gate electrode.

The second object of the present invention is to provide a single electron device, fabricated from Au and fullerene nanoparticles and comprises a first electrode, a second electrode disposed to face the first electrode, and a nanoparticle derivative in a determined array, as a bridge linking to the first electrode and the second electrode, and having formula (III):

wherein,
M represents Au nanoparticles; and A has formula (IV):

wherein
X is N, S, or

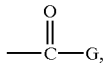

wherein G=OH or $NH_2$;

R is a $C_{1-12}$ alkyl group, a $C_{1-12}$ cycloalkyl group, or a substituted or unsubstituted aromatic group; and F is $C_{60}$, $C_{70}$, or a carbon nanotube.

In the single electron device fabricated from Au and fullerene nanoparticle derivative according to the invention mentioned above, the thermal stability of the device can be efficiently improved due to the use of the fullerene nanoparticles as a bridge linking to electrodes. The fullerenes have excellent thermal stability because they have rigid carbon balls. Furthermore, the utilization of the Au and fullerene nanoparticle derivatives in the present invention can overcome the size limitations in the technology of semiconductor manufacturing process, and thus minute single electron devices with a spacing less than 15 nm between two electrodes mentioned above can be achieved.

Furthermore, in the single electron device of the second present invention, the first electrode is a source electrode and the second electrode is a drain electrode. The determined array can be one-, two-, or three-dimensional.

Additionally, the single electron device according to the second present invention may comprise a third electrode disposed to face the first electrode and the second electrode. Furthermore, the third electrode is a gate electrode.

The third object of the present invention is to provide a nanoparticle derivative, in a determined array for use as a bridge linking to two different electrodes on two substrates respectively and has formula (I):

wherein, M represents nanoparticles of Au, Ag, Pd, or Pt; and A has formula (II):

wherein, X is N, S, or

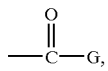

wherein
G=OH or $NH_2$;

R is a $C_{1-12}$ alkyl group, a $C_{1-12}$ cycloalkyl group, or a substituted or unsubstituted aromatic group; and F is $C_{60}$, $C_{70}$, or a carbon nanotube.

Furthermore, in the nanoparticle derivatives of the third present invention, the determined array can be one-, two-, or three-dimensional.

The following examples are intended to illustrate the invention more fully without limiting its scope, since numerous modifications and variations will be apparent to those skilled in this art.

EXAMPLES

Synthesis of Fullerene Derivative $C_{60}$-S

As shown in the following schematic 1, the schematic 1 exemplifies a flowchart for the synthesis of fullerene derivative $C_{60}$-S in one of the preferred embodiments of the present invention.

Schematic 1

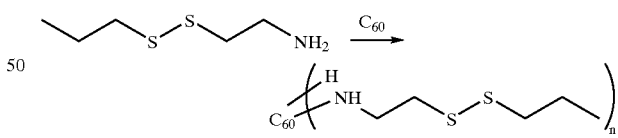

Figure 2:
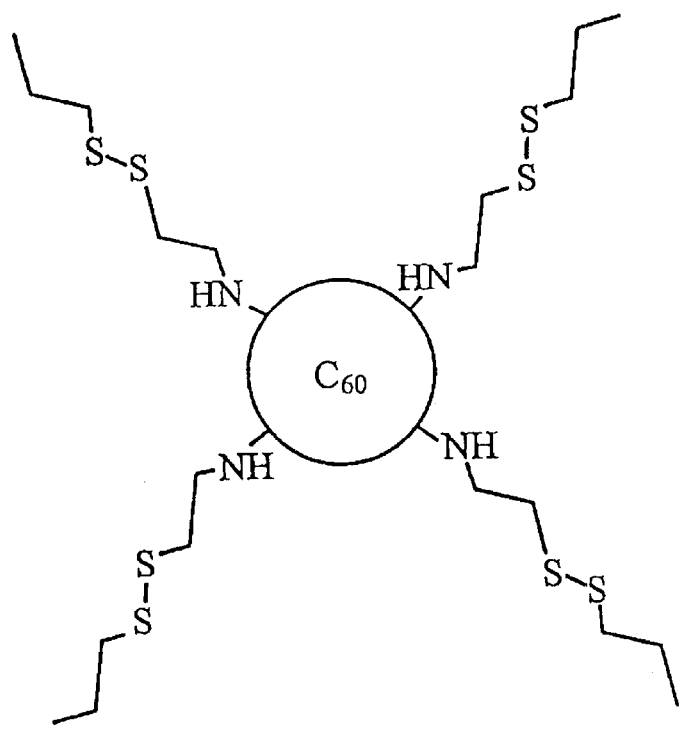
FIG. 2 is a structural schematic of the fullerene derivative $C_{60}$-S produced from the example of the invention.

First, 0.1 g of $C_{60}$ (manufactured by Aldrich Chemical Co.) was added to 3.4 g of propyl 2-aminoethyl disulfide) for reaction, and the resulting mixture was stirred for 3 days to complete the reaction of $C_{60}$. Thereafter, 20 ml of methanol was added to the mixture mentioned above, and a brown precipitate was obtained. The precipitate was filtered, washed several times with methanol, and dried. 0.096 g of fullerene derivative $C_{60}$-S was obtained. The structural schematic is shown in FIG. 2.

Self-assembly of Gold Nanoparticles

First, tetrachloroauric acid (manufactured by Across Chemical CO.) and trisodium citrate (manufactured by Across Chemical CO.) were added to distilled water and subjected to refluxing, and an aqueous solution of gold nanoparticles was prepared. Next, 1 mg of the fullerene derivative $C_{60}$-S obtained from the previous procedure was dissolved in 10 ml of chloroform to result a chloroform solution of fullerene derivative $C_{60}$-S.

Figure 5:
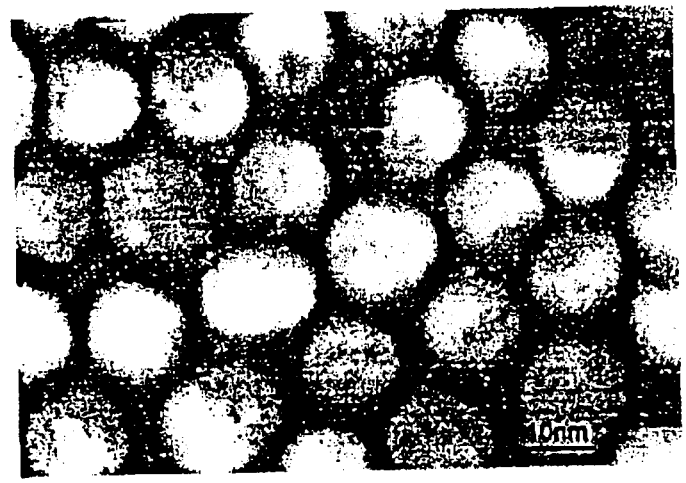
FIG. 5 is a micrograph of transmission electron microscopy of gold nanoparticles and $C_{60}$-S obtained from the example of the invention.

10 ml of the above aqueous solution of gold nanoparticles was poured gently into 10 ml of the above chloroform solution of fullerene derivative $C_{60}$-S to react for 2 to 7 days, obtaining a film formed at the interface between two solutions owing to the self-assembly of gold nanoparticles and fullerene derivative $C_{60}$-S. By observation with transmission electron microscope (TEM, JOEL 100CX II), the film contains gold nanoparticles with an average size of 14.5±2.3 nm and an average spacing of 2.1±0.4 nm between gold nanoparticles. The results are shown in FIG. 5.

Fabrication of Single Electron Transistor

First, a chip with a set of electrodes (source, drain, and gate) was formed on a silicon wafer by electron beam lithography. Next, 1 μl of the above chloroform solution of fullerene derivative $C_{60}$-S was deposited using a micropipette on the chip, and several minutes passed to allow the solvent (chloroform) to evaporate. Then, the chip was washed with chloroform 3 times and blown dry with nitrogen gas.

Figure 6:
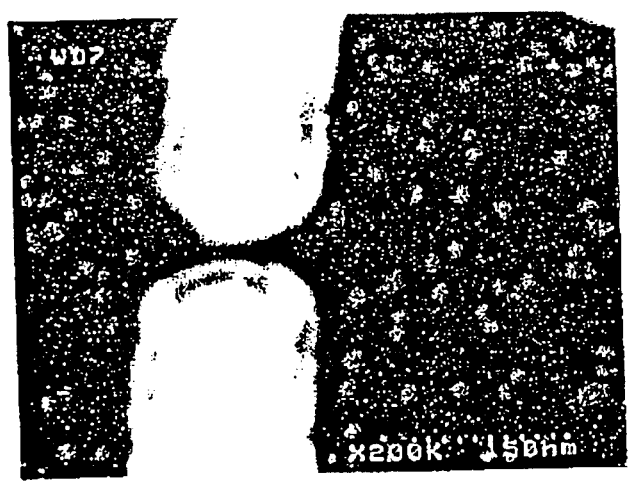
FIG. 6 is a micrograph of scanning electron microscopy of the surface of the resulting chip from the example of the invention.

Last, the chip was floated on the surface of the aqueous solution of gold nanoparticles mentioned above, with the circuit facing down. After one day, the chip was removed from the aqueous solution of gold nanoparticles, washed with distilled water 3 times, and blown dry with nitrogen gas. Then, the single electron device fabricated from Au and fullerene nanoparticles of the present invention was obtained. By observation of the surface of the resulting chip with scanning electron microscope (SEM), the spacing between gold electrodes was about 15 nm. The results are shown in FIG. 6. (The gate electrode is not shown in FIG. 6.)

Figure 3:
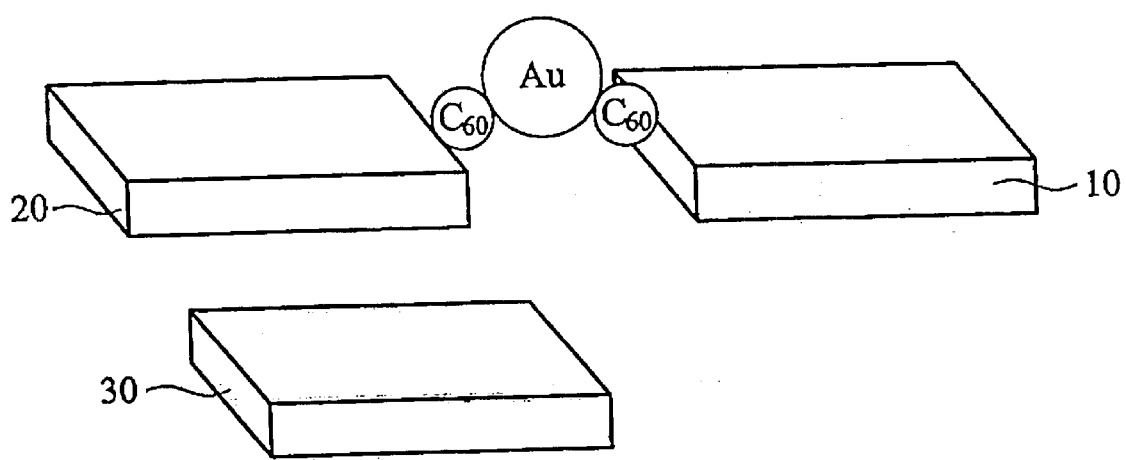
FIG. 3 is a schematic cross section of the single electron transistor fabricated from Au and fullerene nanoparticle derivatives produced from the example of the invention.

FIG. 3 is a schematic cross section of the single electron transistor fabricated from Au and fullerene nanoparticle derivatives of the invention mentioned above. In this figure, the gold and fullerene nanoparticle derivatives of the present invention are arranged in one-dimensional array and as a bridge linking to the source electrode 10 and the drain electrode 20, and the gate electrode 30 is used to adjust the voltage of the nanoparticles.

In the single electron device fabricated from nanoparticle derivatives according to the invention mentioned above, the thermal stability of the device can be efficiently improved, because the thermal fluctuation in the nanoparticle arrays is reduced by the use of the nanoparticle derivatives as a bridge linking to electrodes. The nanoparticle derivatives are constituted by fullerenes which have rigid carbon balls with excellent thermal stability. Furthermore, the utilization of the nanoparticle derivatives in the present invention overcomes the size limitations in the technology of semiconductor manufacturing process, and thus minute single electron devices with a spacing less than 15 nm between two electrodes mentioned above can be achieved.

Figure 4:
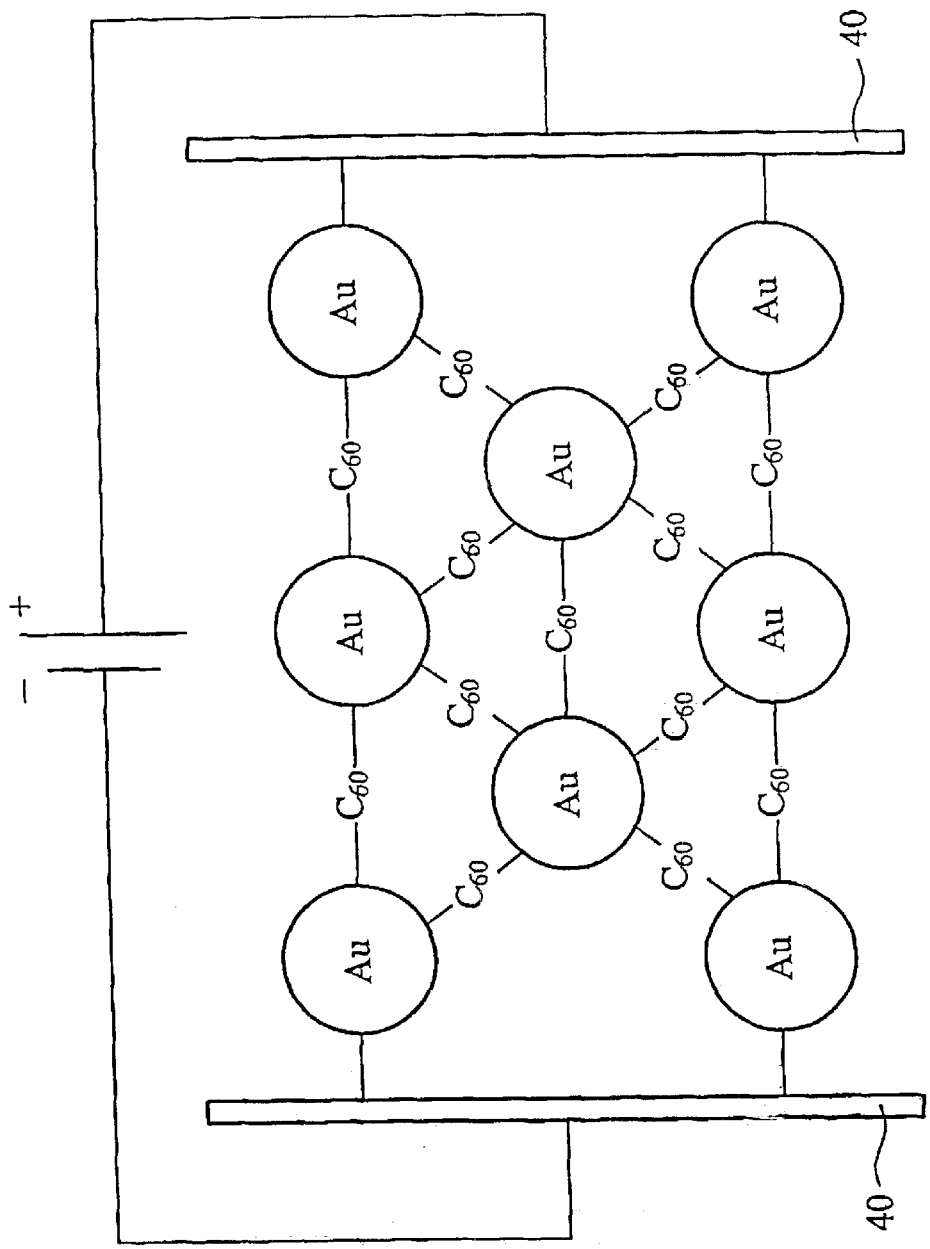
FIG. 4 shows the nanodevice fabricated from fullerene derivative $C_{60}$-S produced from the example of the invention.

Additionally, FIG. 4 shows the nanodevice fabricated from fullerene derivative $C_{60}$-S produced from the example of the invention mentioned above, wherein 40 represents an electrode substrate. In the example of the invention mentioned above, although Au and fullerene nanoparticle derivatives are arranged in a one-dimensional array and as a bridge linking to the source electrode and the drain electrode, it is not limitative to the present invention. The Au and fullerene nanoparticle derivatives may be arranged in a two- or three-dimensional array, as show by FIG. 4.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A single electron device comprising:
   a first electrode;
   a second electrode disposed to face the first electrode; and
   a nanoparticle derivative arranged in a predetermined array to bridge the first electrode and the second electrode, having formula (I):

   —A—M—A—     (I)

wherein,
   M represents nanoparticles of Au, Ag, Pd, or Pt; and
   A has formula (II):

   —X—R—F—R—X—     (II)

wherein
   X is N, S, or

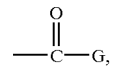

wherein G=OH or $NH_2$;
   R is a $C_{1-12}$ alkyl group, a $C_{1-12}$ cycloalkyl group, or a substituted or unsubstituted aromatic group; and
   F is $C_{60}$, $C_{70}$, or a carbon nanotube.

2. The single electron device as claimed in claim 1, wherein the first electrode is a source electrode.

3. The single electron device as claimed in claim 1, wherein the second electrode is a drain electrode.

4. The single electron device as claimed in claim 1, wherein the nanoparticle derivative is arranged in a one-dimensional array.

5. The single electron device as claimed in claim 1, wherein the nanoparticle derivative is arranged in a two-dimensional array.

6. The single electron device as claimed in claim 1, wherein the nanoparticle derivative is arranged in a three-dimensional array.

7. The single electron device as claimed in claim 1, further comprising a third electrode disposed to face the first electrode and the second electrode.

8. The single electron device as claimed in claim 7, wherein the third electrode is a gate electrode.

9. A single electron device comprising:
   a first electrode;
   a second electrode disposed to face the first electrode; and
   a nanoparticle derivative arranged in a predetermined array to bridge the first electrode and the second electrode, and having formula (III):

   —A—M—A—     (III)

wherein,
M represents Au nanoparticles; and
A has formula (IV):

$$-X-R-F-R-X- \quad (IV)$$

wherein
X is N, S, or

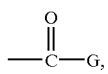

wherein G=OH or $NH_2$;
R is a $C_{1-12}$ alkyl group, a $C_{1-12}$ cycloalkyl group, or a substituted or unsubstituted aromatic group; and
F is $C_{60}$ or $C_{70}$.

10. The single electron device as claimed in claim 9, wherein the first electrode is a source electrode.

11. The single electron device as claimed in claim 9, wherein the second electrode is a drain electrode.

12. The single electron device as claimed in claim 9, wherein the nanoparticle derivative is arranged in a one-dimensional array.

13. The single electron device as claimed in claim 9, wherein the nanoparticle derivative is arranged in a two-dimensional array.

14. The single electron device as claimed in claim 9, wherein the nanoparticle derivative is arranged in a three-dimensional array.

15. The single electron device as claimed in claim 9, further comprising a third electrode disposed to face the first electrode and the second electrode.

16. The single electron device as claimed in claim 15, wherein the third electrode is a gate electrode.

17. A nanoparticle derivative having formula (I):

$$-A-M-A- \quad (I)$$

wherein,
M represents nanoparticles of Au, Ag, Pd, or Pt; and
A has formula (II):

$$-X-R-F-R-X- \quad (II)$$

wherein
X is N, S, or

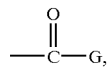

wherein G=OH or $NH_2$;
R is a $C_{1-12}$ alkyl group, a $C_{1-12}$ cycloalkyl group, or a substituted or unsubstituted aromatic group; and
F is $C_{60}$, $C_{70}$, or a carbon nanotube.

18. The nanoparticle derivative as claimed in claim 17, wherein in formula (I) the M is Au, in formula (II) the X is S, R is propyl and F is $C_{60}$.

19. The nanoparticle derivative as claimed in claim 17, wherein the nanoparticle derivative is arranged in a one-dimensional array.

20. The nanoparticle derivative as claimed in claim 17, wherein the nanoparticle derivative is arranged in a two-dimensional array.

21. The nanoparticle derivative as claimed in claim 17, wherein the nanoparticle derivative is arranged in a three-dimensional array.

* * * * *